United States Patent
Kajala et al.

(10) Patent No.: US 6,836,243 B2
(45) Date of Patent: Dec. 28, 2004

(54) SYSTEM AND METHOD FOR PROCESSING A SIGNAL BEING EMITTED FROM A TARGET SIGNAL SOURCE INTO A NOISY ENVIRONMENT

(75) Inventors: Matti Kajala, Tampere (FI); Matti Hämäläinen, Kanavatie (FI)

(73) Assignee: Nokia Corporation, Espoo (FI)

(*) Notice: Subject to any disclaimer, the term of this patent is extended or adjusted under 35 U.S.C. 154(b) by 0 days.

(21) Appl. No.: 10/363,331

(22) PCT Filed: Aug. 31, 2001

(86) PCT No.: PCT/EP01/10053
§ 371 (c)(1),
(2), (4) Date: Jul. 10, 2003

(87) PCT Pub. No.: WO02/18969
PCT Pub. Date: Mar. 7, 2002

(65) Prior Publication Data
US 2004/0013038 A1  Jan. 22, 2004

(30) Foreign Application Priority Data
Sep. 2, 2000 (EP) .............................................. 00119081

(51) Int. Cl.[7] .............................. H01Q 3/26; G01S 3/802
(52) U.S. Cl. ....................... 342/377; 342/372; 342/374; 367/122; 367/123; 381/92
(58) Field of Search ................................ 342/377, 373, 342/372, 374; 367/119–123; 381/92

(56) References Cited

U.S. PATENT DOCUMENTS

| | | | |
|---|---|---|---|
| 4,741,038 A | 4/1988 | Elko et al. | |
| 4,802,227 A | 1/1989 | Elko et al. | |
| 5,473,701 A | 12/1995 | Cezanne et al. | |
| 5,647,006 A | 7/1997 | Martin | |
| 5,664,021 A | 9/1997 | Chu et al. | |
| 6,449,593 B1 | 9/2002 | Valve | |
| 6,594,367 B1 * | 7/2003 | Marash et al. ............... 367/119 |
| 6,665,545 B1 * | 12/2003 | Raleigh et al. ............ 455/562.1 |

FOREIGN PATENT DOCUMENTS

| WO | WO 9534983 | 12/1995 |
|---|---|---|
| WO | WO 95/34983 | 12/1995 |

OTHER PUBLICATIONS

Z. Zhang et al., Hybrid smart antenna system using directional elements—performance analysis in flat Rayleigh fading, IEEE MTT-S International Microwave Symposium Digest, vol. 3, p. 1537–1540, Jun. 2003.*

(List continued on next page.)

*Primary Examiner*—Bernarr E. Gregory
*Assistant Examiner*—Fred H. Mull
(74) *Attorney, Agent, or Firm*—Ware, Fressola, Van Der Sluys & Adolphson

(57) ABSTRACT

The invention relates to a system and method for processing a signal being emitted from a target signal source 20 into a noisy environment, wherein said target signal source 20 is located in a target signal source direction $\phi_s$ with regard to the position of a transducer array 10, the method comprising the following steps: receiving, transforming and filtering said signal according to filter coefficients of a beamformer 30I, 30II in order to generate at least one beamformer output signal $y'_i(n)$, i=1 . . . N, the filter coefficients defining a desired predetermined filter characteristic of the beamformer; and generating a control signal t(n) representing said target signal source direction $\phi_s$. It is the object of the invention to improve such a system and method in the way that clear signal reception is achieved for any target signal source direction $\phi_s$ with only a minimum of computational effort and memory capacity. That object is achieved by providing adjustable filter coefficients which are generated in response to said control signal t(n) such that the beamformer 30I, 30II has a predetermined filtering characteristic for said target signal source 20 at said target signal source direction $\phi_s$.

27 Claims, 15 Drawing Sheets

OTHER PUBLICATIONS

Z. Zhang et al., Hybrid smart antenna system using directional elements—performance analysis in flat Rayleigh fading, IEEE Transactions on Antennas and Propagation, vol. 51(10), p. 2926–2935, Oct. 2003.*

"*Existence and Uniqueness of the Interpolating Polynomial,*" Section 2.2, *Interpolation by Polynomials*, p. 38.
"Existence and Uniqueness of the Interpolating Polynomial" Section 2.2, Interpolation by Polynomials, p. 38.

* cited by examiner

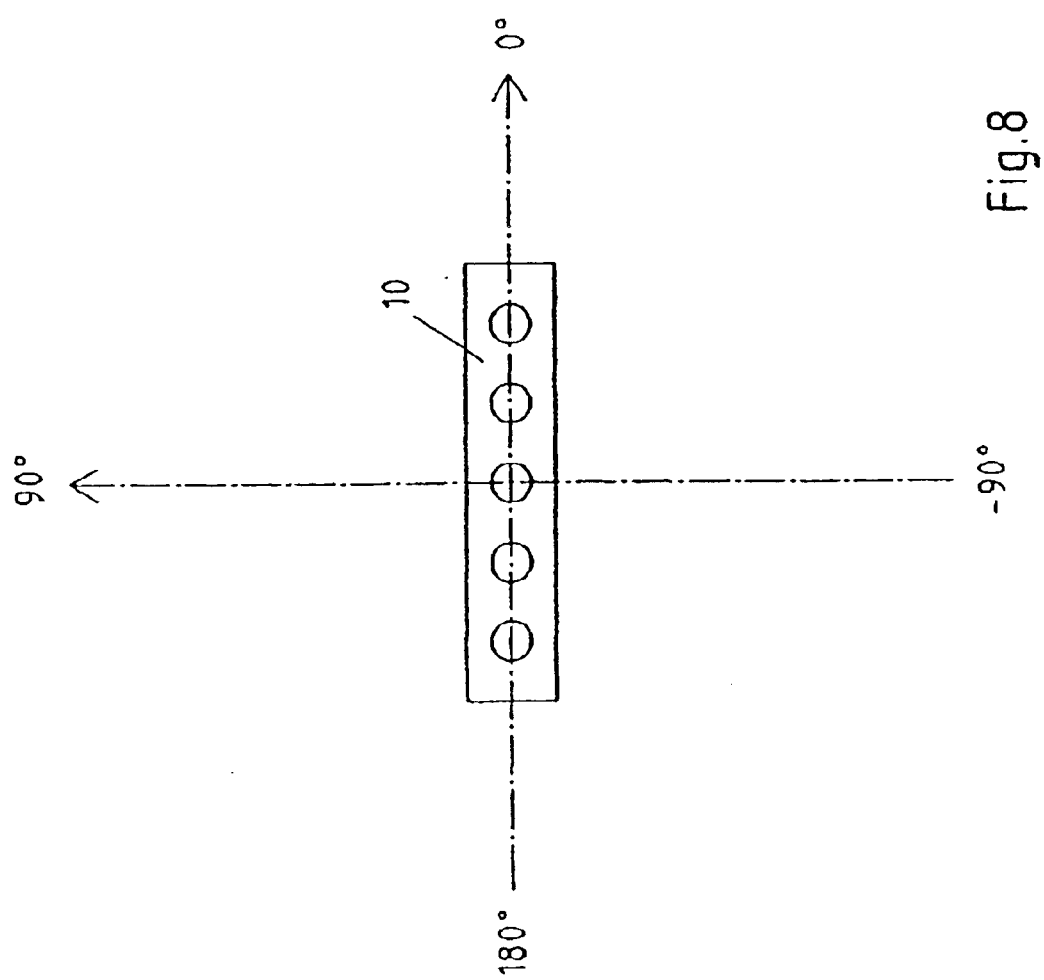

SYSTEM AND METHOD FOR PROCESSING A SIGNAL BEING EMITTED FROM A TARGET SIGNAL SOURCE INTO A NOISY ENVIRONMENT

CROSS REFERENCE TO RELATED APPLICATIONS

This application is for entry into the U.S. national phase under §371 for International Application No. PCT/EP01/10053 having an international filing date of Aug. 31, 2001, and from which priority is claimed under all applicable sections of Title 35 of United States Code including, but no limited to, Sections 120, 363 and 365(c), and which in turn claims priority under 35 USC §119 to European Patent Application No. 00119081.8 filed on Sep. 2, 2000.

TECHNICAL FIELD

The invention relates to a system for processing a signal being emitted from a target signal source into a noisy environment, wherein said target signal source is located in a target signal source direction $\phi_s$ with regard to the position of a transducer array, the system comprising: the transducer array having M transducers for receiving said signal being mixed with noise, each of the transducers generating a corresponding transducer output signal, respectively and a beamformer for receiving and filtering said M transducer output signals in order to generate at least one output signal $y'_i(n)$ i=1 ... N, said beamformer comprising filter coefficients defining a predetermined filtering characteristic, e.g. a desired look direction.

The invention further relates to a method for processing a signal being emitted from a target signal source into a noisy environment, carried out by said system.

BACKGROUND OF THE INVENTION

Beamforming systems are typically used to improve the quality of a received signal by processing the signals received by an array of multiple transducers. Transducer array signal processing can be utilized to enhance the performance of the receiving system capturing the desired signal that has been emitted into a noisy environment. Beamforming methods enable steering of the maximum sensitivity (look direction) of the transducer array towards any desired signal source by changing the beamforming filter coefficients. Typical applications can be found in radio communications, radar signal processing, underwater acoustics, and speech acquisition for teleconferencing and hands-free systems.

It is known in the art that according to principle of reciprocity the signal sources and receivers are interchangeable and by changing the direction of the signal flow and replacing the receiving transducers with transmitting transducers a corresponding signal can be emitted from the transducer array to direction $\phi_s$.

Different beamforming methods have been studied widely in the literature. One of the most frequently studied methods is adaptive beamforming in which the filter coefficients are adjusted according to the received signal characteristics. A well known adaptive beamforming method has been presented by Frost (Frost O. L., "An algorithm for linearly constrained adaptive array processing", Proc. IEEE, Vol. 60, No. 8, pp. 926–935, August 1972). Frost's method has been further developed by Griffiths and Jim (Griffiths L. J., Jim C. W., "An alternative approach to linearly constrained adaptive beamforming", IEEE Trans. Antennas Propag., Vol. AP-30, No. 1, pp. 27–34, January 1982). The fundamental problem of these adaptive beamformers is that the adaptive filters are designed to cancel the noise term in the beamformer output signal but, in practice, the noise estimate also contains a component that correlates with the desired signal. Therefore, the adaptive filters do not only attenuate the noise but they also cause unpredictable distortion of the desired signal. Said correlation is typically caused by multi-path propagation, misaligned look direction, or improper modeling and variations in the propagation medium.

In order to alleviate the desired signal distortion it is more favorable to design a fixed beamforming filter that is optimized for a given application.

The advantage of a fixed beamforming implementation is that the fixed filter coefficients can be optimized based on a priori knowledge of the source and the medium as well as the desired performance criteria so that the filtering performance is deterministic.

Such a design can be formulated as a spatio-temporal filter design problem where the array geometry (transducer positions) and the temporal sampling interval define a spatio-temporal sampling grid. It is known in the art that both the spatio-temporal sampling grid and the corresponding beamformer filter coefficients can be optimized without suffering from the distortion of the desired signal (Kajala M., Hämäläinen M., "Broadband beamforming optimization for speech enhancement in noisy environments", IEEE Workshop on Applications of Signal Processing to Audio and Acoustics, October 1999). Such a system and method will now be described in more detail by referring to FIGS. 10 to 12.

The system according to FIG. 10 comprises a transducer array 10, which comprises several transducers 10-j, j=1 ... M. The transducers receive a signal emitted from a signal source 20 and being mixed or superimposed with noise. Transducers can be e.g. microphones to receive and transform pressure signals into electrical signals.

Said signal source is located in a target signal source direction $\phi_s$ with regard to the position of the transducer array 10. As illustrated in FIG. 11 said target signal source direction $\phi_s$ generally represents the 3-dimensional position of the target signal source in space, e.g. in Cartesian coordinates $\phi_s=(X_s, Y_s, Z_s)$ or in spherical polar coordinates $\phi_s=(r_s, \phi_s, \theta_s)$, relative to the transducer array 10 which is in FIG. 11 assumed to be located in the center of the coordinate system. If signals come from the far field, they can be modeled as plane waves. In that case, the distance $r_s$ becomes redundant and the signal source direction $\phi_s$ reduces to $\phi_s=(\phi_s, \theta_s)$.

When receiving said signal the transducers 10-1 ... 10-M of said transducer array 10 according to FIG. 10 generate analogue signals which are subsequently sampled by a multichannel analogue to digital converter 15. The sampled signals $x_1(n) ... x_M(n)$ are fed into an elementary beamformer 30. Said beamformer is represented by a filter bank comprising M FIR filters 35-1 ... 35-M. An output signal y'(n) of said beamformer 30 is formed by adding the output signals $x'_1(n) ... x'_M(n)$ of said FIR filters, respectively.

The beamformer 30 is adapted to steer the beam shape of the transducer array 10 to any particular look direction $\phi_i$, by using a filter with an appropriate set of fixed filter coefficients. Said look direction $\phi_i$ of the beamformer does in general not necessarily coincide with the target signal source direction $\phi_s$.

In the case that the signal is emitted from said signal source 20 into a noisy environment the sampled transducer signals $x_1(n) \ldots x_M(n)$ represent a noisy signal. At the same time, if the look direction $\phi_i$ to which the directivity of the beamformer 30 is correctly adjusted coincides with the target signal source direction $\phi_s$, the noisy components in the transducer signals are substantially suppressed. The output signal y'(n) of the filter bank 30 estimates the signal emitted from said signal source 20; i.e. the signal to noise ratio SNR or any other appropriate measure of quality of the filtered signal y'(n) is maximized. Due to the fact that the beamformer 30 in FIG. 10 comprises only one set of fixed filter coefficients, the successful use of said system requires apriori knowledge about the target signal source direction $\phi_s$. In order to enhance the beamformer output signal y'(n), it is necessary to align the look direction $\phi_i$ of the beamformer with said target signal source direction $\phi_s$ by providing an appropriate set of fixed filter coefficients.

The sequential alignment of the elementary beamformer's directivity to several predetermined look directions $\phi_i$, i=1 ... N, e.g. to track a moving signal source, a respective set of fixed filter coefficients for each predetermined look direction $\phi_i$ has to be stored in a memory and implemented in said filter before usage. This would be very ineffective. Consequently, the system according to FIG. 10 is not appropriate for processing signals emitted from different signal sources located in different target directions $\phi_{s,p}$ p=1 ... P with respect to the transducer array 10.

FIG. 12 shows an advanced beamformer 30' capable to suboptimally overcome the disadvantages of the elementary beamformer. The advanced beamformer 30' comprises $N \geq 1$ filter banks 30-1 ... 30-N and is thus adapted to simultaneously calculate the beamformer output signals $y'_1(n) \ldots y'_N(n)$.

Each of said filter banks comprises M finite impulse response FIR-filters for respectively receiving the same input signal vector $\underline{x}(n)=[x_1(n) \ x_2(n) \ldots x_M(n)]$, which is the output of the multi-channel analogue to digital converter 15. The M filters 35-i-1 ... 35-i-M in each of the i=1-N filter banks are respectively characterized by the individual set of fixed filter coefficients with the result that each filter bank is adapted to one out of N look directions $\phi_i$, i=1 ... N.

The output signals of the beamformer in FIG. 12, i.e. the output signals of the filter banks 30-1 ... 30-N, can be expressed as $$y'_i(n) = \sum_{j=1}^{M} \sum_{k=0}^{L_{i,j}-1} h_{i,j,k} x_j(n-k), \ i=1 \ldots N, \quad (1)$$

wherein $L_{i,j}$ is the length of the filter 35-i-j having fixed filter coefficients $h_{i,j,k}$, k=0 ... $L_{i,j}$. Assuming $L_{i,j}$=L, for all i=1 ... N and j=1 ... M the $i^{th}$ output signal $y'_i(n)$ can be rewritten in the form $$y'_i(n) = \sum_{j=1}^{M} \sum_{k=0}^{L-1} h_{i,j,k} x_j(n-k), \ i=1 \ldots N. \quad (2)$$

One of the signals $y'_i(n)$, i=1 ... N, can be selected as a desired output signal representing the best estimate of the signal being emitted towards the transducer array.

Said selection is done by a mixer 60 which preferably selects P signals out of said N beamformer output signals $y'_i(n)$ i=1 ... N. Said P selected signals may represent P signals $y_p(n)$ for p=1 ... P emitted from P different signal sources 20-1 ... 20-P in respective target signal source directions $\phi_{s,p}$ for p=1 ... P when the respective look directions $\phi_i$ of the beamformer output signals come at least close to said target signal source directions $\phi_{s,p}$. Moreover, the mixer 60 can combine one or more beamformer output signals $y'_i(n)$ representing said signal sources 20-1 ... 20-P together in one output signal $y_p(n)$ which may be desired e.g. in teleconferencing. In a simple implementation, when switching operation is preferred between different look directions, the mixer can be replaced with a multiplexer. The output signal selection is done by a beamformer output control unit 70 that provides a control signal to the mixer 60. In general the control unit 70 instructs the mixer 60 to select that beamformer output signal $y'_i(n)$ which has the best filtering performance, e.g. the look direction $\phi_i$ that comes closest to the direction $\phi_{s,p}$ in which the desired signal has actually been emitted.

The prior art system according to FIG. 12 comprising M transducers 10-1 ... 10-M and M*L finite impulse response FIR filters 35-i-1 ... 35-i-M of length L needs to keep up to $$\text{Mem}_{pri}(S) = M * L * N \quad (3)$$

coefficients in a memory in order to filter $S \leq N$ signals in parallel. In that case the computational load is defined by at least $$\text{Load}_{pri}(S) = M * L * S \quad (4)$$

multiply-and-accumulate operations per sampling interval to form the S simultaneous beamformer output signals $y'_i(n)$. Moreover, there are only a maximum number of N predetermined fixed look directions available in the advanced beamformer 30', being formed by the N filter banks.

To the contrary, a signal may also be emitted in a target signal source direction $\phi_{s,p}$ which does not coincide with any of said predetermined N look directions $\phi_i$, i=1 ... N. In this case the operation of the system would only be suboptimal, wherein the degree of suboptimalism depends on the difference between the actual target signal source direction $\phi_{s,p}$ in which the signal is emitted from the signal source and the look direction $\phi_i$ to which the beamformer is adjusted.

The prior art system according to FIG. 12 has the disadvantage that for each desired look direction $\phi_i$ of the beamformer a separate filter bank operating with an individual set of fixed filter coefficients has to be provided. Further, the system according to FIG. 12 enables only suboptimal receipt and restoration of signals being emitted in a target signal source direction $\phi_{s,p}$ which does not exactly coincide with any of the predetermined look directions $\phi_i$ of the beamformer, defined by the fixed coefficients.

This invention utilizes the theory of so called 1-dimensional (1-D) polynomial filters. It is known in the art that coefficients of a variable 1-D FIR filter can be represented as a polynomial. Polynomial based filters have been applied for variable delays (Farrow C. W., "A continuously variable digital delay element", ISCAS -88, pp. 2641–2645, 1988.), fractional delay filtering (Laakso T. I., Välimäki V., Karjalainen M., Laine U. K., "Splitting the unit delay—tools for fractional filter design", IEEE Signal Processing Magazine, pp. 30–60, January 1996.), digital receivers (Tuukkanen V., Vesma J., Renfors M., "Combined interpolation and maximum likelihood symbol timing in digital receivers", 1997 IEEE 6th International Conference on Universal Personal Communications Record, Vol. 2, pp. 698–702, 1997), digital modems (Erup L., Gardner F. M., Harris R. A., "Interpolation in digital modems—Part II: implementation and performance", IEEE Trans. on Comm., Vol. 41, No. 6, pp. 998–1008, June 1993.), and modeling of acoustic tubes (Välimäki V., "Discrete-time modeling of acoustic tubes using fractional delay filters", Ph. D. Thesis, Helsinki University of Technology, Otaniemi, 1995/Report 37, pp. 95–104, 1995). All these methods aim to adjust the delay characteristics of a single 1-D FIR filter without affecting the magnitude spectrum of the signal. Another design method for variable 1-D FIR filters with variable cut-off frequencies has been presented by Deng (Deng T.-B., "Weighted least-squares method for designing arbitrarily variable 1-D FIR digital filters", Signal Processing, Vol. 80, pp. 597–613, 2000).

The optimal filter structure presented by Farrow for continuously variable digital delay has been generalized for 1-D polynomial based FIR filters. It is known in the art that the so called Farrow structure can be used to implement 1-D polynomial based FIR filters that support adjusting of filter characteristics using a single control parameter.

In order to steer the look direction of the elementary beamformer in FIG. 10, it would be possible to preprocess the transducer signals utilizing variable delay filters. However, this type of implementation would suffer from several drawbacks: optimal filtering characteristics of the elementary beamformer would be degraded when the look direction differs from the designed look direction of the original elementary beamformer, implementation of good enough 1-D fractional delay FIR filter would require considerably high filter orders, and each transducer signal would require a separate control parameter that would be dependent on each other.

SUMMARY OF THE INVENTION

In view of that situation it is the object of the invention to improve a system and method for processing a signal being emitted into a noisy environment in the way that clear signal reception is achieved for any target signal source direction $\phi_s$ with only a minimum of computational effort and memory capacity.

The object is solved for the system as described above in the way that a beamformer beam shape control system is provided for generating a control signal t(n) representing at least one physically relevant parameter for said target signal source, in particular said target signal source direction $\phi_s$, that said filter coefficients of the beamformer are adjustable and that a filter coefficient generator means is provided for generating said filter coefficients in response to said control signal t(n) such that the beamformer has a predetermined filtering characteristic for said target signal source at said target signal source direction $\phi_s$.

The beamformer beam shape control system includes means to detect all relevant parameters for said target signal source in relation to the transducer array, in particular said target signal source direction $\phi_s$. According to the invention the beamforming filtering characteristic is exactly aligned to said parameters, in particular with said target signal source direction.

It is the main advantage of the system that the filter coefficients of the beamformer are not fixed but adjustable. The adjustable filter coefficients enable efficient calculation of multiple beamforming filters and thus the system is easily adjustable to the above mentioned physical parameters of a specific signal source. In particular the adjustable filter coefficients enable the system to continuously and smoothly steer the look direction of the beamformer. Expressed in other words, the system is adapted to point the best selectivity towards any desired target source direction and not only towards one of the predetermined target directions, as provided by the advanced beamformer known in the prior art. I.e. infinite accuracy is provided for pointing the look direction of the beamformer towards an arbitrary location of any desired signal source requiring only small memory and computational power. In that way an optimal predetermined filtering characteristic for any target signal source direction can be established.

The signal source emitting the signals received by the system is not restricted by its nature or by its location in space nor by the frequency of the signals generated by them. Consequently, there is the advantage that the system can be adapted to any kind of signals issued from the signal source.

Due to the automatic steering of the directivity of the beamformer or the transducer array in response to said control signal t(n) the system is very suitable for hands-free communications.

According to all embodiments of the invention it is advantageous that the beamformer having said adjustable filter coefficients has a polynomial filter characteristic. Such a characteristic enables simple calculation of the beamformer output signals.

It is advantageous that the filter coefficients are decomposed into fixed and variable filter parameters. Only the fixed filter parameters for one adjustable beamforming filter have to be stored in a memory and thus less memory capacity is required in comparison with the prior art system. Moreover, only the variable filter parameters have to be changed in order to steer the directivity of the beamformer and thus computational effort is reduced.

Preferably, the number of variable filter parameters is less than the number of fixed filter parameters. In that case the advantages of reduced memory capacity and computational effort are supported.

Advantageously, the adjustable filter coefficients of said polynomial filter characteristic are approximated by the following equation:

$$h_{j,k}(D_i) = a_0(j,k)F_0(D_i) + a_1(j,k)F_1(D_i) + \ldots a_T(j,k)F_T(D_i),$$

wherein $a_r(j,k)$ are the fixed filter parameters,
wherein $D_i$ is a vector of variable filter parameters, represented by said control signal t(n); and
wherein $F_r(D_i)$ are functions of said vector $D_i$. This interpolation polynomial $h_{j,k}(D_i)$ enables an easy change of the filter coefficients with insignificant computational complexity.

Said vector of variable filter parameters $D_i$ may be a single variable modeling an optimal polynomial filter for a trace of target signal source directions $\phi_s$ in space. More flexible source tracking in space would be possible by using a vector $D_i$ of three variables, e.g. representing the distance r, azimuth $\phi$, and elevation $\theta$ of the target signal source direction $\phi_s$.

In addition to the geometrical parameters, said vector of variable filter parameters $D_i$ may also represent one of the physically relevant parameters like background noise spectrum, desired signal bandwidth, signal spectrum, beam shape, physical properties of the medium such as temperature, system parameters such as camera control, or a combination thereof.

The functions are preferably Taylor functions because Taylor functions are easy to apply. However, the functions may also be Chebyshev functions in order to support optimization to minimize the maximum error.

According to a first embodiment of the invention the system comprises a memory for storing the fixed filter parameters $a_t(j,k)$, the filter coefficient generating means for adjusting said filter coefficients according to equation $h_{j,k}(D_i)=a_0(j,k)F_0(D_i)+a_1(j,k)F_1(D_i)+ \ldots +a_r(j,k)F_r(D_i)$, and a signal processing means for processing the transducer output signals using said filter coefficients $h_{j,k}(D_i)$.

Advantageously, said signal processing means is adapted to generate a beamformer output signal $y'_i(n)$, i=1 ... N, by using equation $$y'_i(n) = \sum_{j=1}^{M}\sum_{k=0}^{L-1} h_{j,k}(D_i)x_j(n-k).$$

Processing the signals $y'_i(n)$ according to said equation has the advantage that the adaptation of the system to any arbitrary target direction can be supported by only adjusting said vector of variable filter parameters $D_i$ in response to said control signal t(n). Consequently, the computational effort for carrying out the adaptation is reduced to a minimum. Calculating several beamformer output signals in parallel facilitates the detection of the most appropriate signal according to the predetermined decision criteria.

According to a second embodiment of the invention the beamformer comprises: at least two filter banks each of which receives and filters said M transducer output signals in order to generate an intermediate signal $y''_t(n)$, t=0 ... T; at least one post filter for receiving said at least two intermediate signals $y''_t(n)$ in order to generate said beamformer output signal $y'_i(n)$ i=1 ... N in response to said control signal t(n) wherein the filter coefficient generator means is implemented in the combination of said at least two filter banks and said at least one post filter.

Preferably, each of said at least two filter banks calculates the intermediate signal $y''_t(n)$ from the transducer output signals $x_j(n-k)$ according to the following equation:

$$y''_t(n) = \sum_{j=1}^{M}\sum_{k=0}^{L-1} a_t(j,k)x_j(n-k)$$

wherein $a_t(j,k)$ are predetermined fixed filter parameters. Said post filter calculates the beamformer output signal $y'_i(n)$, i=1 ... N from said intermediate signals $y''_t(n)$ according to the following equation:

$$y'_i(n) = \sum_{t=0}^{T} y''_t(n)D_i^t;$$

wherein $D_i$ is a vector of variable filter parameters represented by said control signal t(n).

Advantageously, the filter banks contain said fixed filter parameters whereas the post filter contains said variable filter parameters. In that way a proper separation between the processing of the fixed and the variable filter parameters for aligning the beam shape of the beamformer is achieved.

In any embodiment of the invention the transducers are preferably arranged linearly, 2-dimensionaly or 3-dimensionaly in said transducer array 10. Furthermore, they may have an omni-directional, a bi-directional, or some more complicated directional sensitivity characteristics, or a combination thereof. In that way an optimal receipt of the signals is achieved for any kind of signal characteristics. Transducer sensitivity characteristics can be taken into account in the design procedure of the beamforming filters and thus they do not limit the invention.

The transducers in the transducer array are preferably embodied as microphones for receiving acoustical signals, as antenna elements for receiving electromagnetic signals, or as hydrophones for receiving underwater acoustical signals.

It is advantageous that the system comprises at least one mixer for receiving and further processing at least two of said beamformer output signals $y'_i(n)$. In that way particular target signal source directions or combinations thereof can be selected for further processing.

For canceling echo effects in the output signal $y'_i(n)$ of the beamformer the system advantageously comprises an echo cancellation unit.

The system advantageously comprises an echo cancellation control unit for controlling said echo cancellation unit in response to said control signal t(n). In that way the performance of said echo cancellation unit is increased.

For further canceling noise in the output signal $y'_i(n)$ of the beamformer the system advantageously comprises a noise cancellation unit.

The system advantageously comprises a noise cancellation control unit for controlling said noise cancellation unit in response to said control signal t(n). In that way the performance of said noise cancellation unit is increased.

The object of the invention is further solved by a method for processing a signal received from a target signal source into a noisy environment. The advantages of said method correspond to the advantages of the system as discussed above.

BRIEF DESCRIPTION OF THE DRAWINGS

In the following, different embodiments of the invention are described in detail by referring to the following figures, wherein

FIG. 8 is an auxiliary figure illustrating the location of a transducer array in a coordinate system as assumed for FIGS. 9a ... 9c;

DESCRIPTION OF THE PREFERRED EMBODIMENTS

Before discussing particular embodiments of the invention the following remarks referring to all embodiments of the invention are made.

Figure 12:
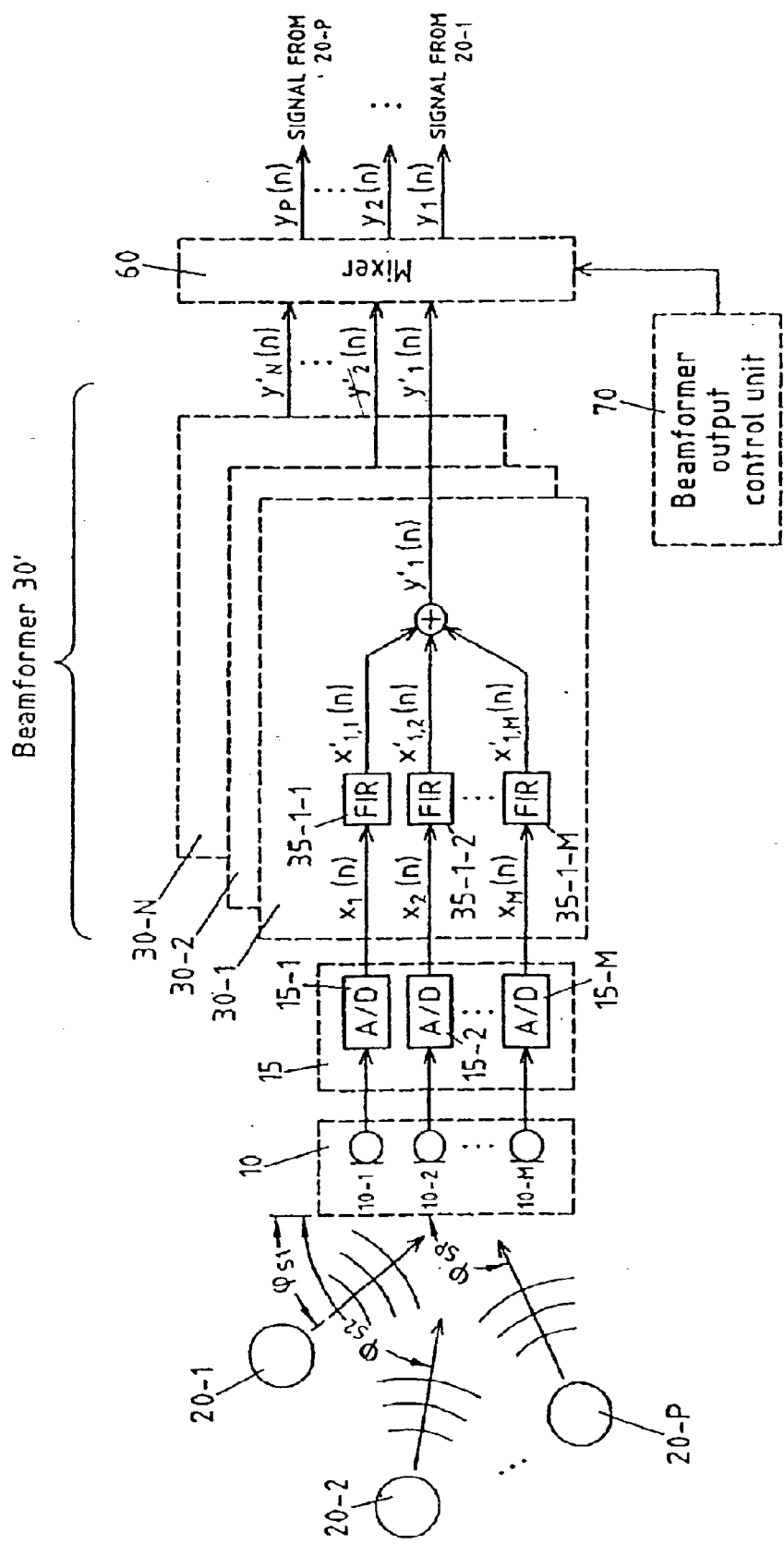
FIG. 12 shows an advanced system as known in the art.

All embodiments of the system according to the present invention substantially differ from the prior-art system shown in FIG. 12 only in the embodiment and operation of the beamformer. Consequently, the signal sources 20-p, the transducer array 10, the multi-channel analogue to digital converter 15, the mixer 60 and the beamformer output control unit 70 as well as their respective operations in the embodiments according to the invention correspond to the respective components and operations in FIG. 12. The same applies to the definition of the target signal source directions $\phi_{s,p}$ and the look direction $\phi_i$ of the beamformer.

In the invention two embodiments of the beamformer 30 are discussed. According to both embodiments the beamformers receive the input signals $x_1(n) \ldots x_M(n)$ and calculate the beamformer output signals $y'_i(n)$ by using the same equation $$y'_i(n) = \sum_{j=1}^{M} \sum_{k=0}^{L-1} h_{j,k}(D_i)x_j(n-k). \tag{5}$$

In equation 5 the term $h_{j,k}(D_i)$ represents the adjustable filter coefficients of the beamformer, which can in a very general manner be calculated according to the following polynomial $$h_{j,k}(D_i)=a_0(j,k)F_0(D_i)+a_1(j,k)F_1(D_i)+ \ldots +a_T(j,k)F_T(D_i); \tag{6}$$

wherein $a_t(j,k)$ are fixed filter parameters, with $t=0 \ldots T$, $j=1 \ldots M$ and $k=0 \ldots L-1$, wherein $D_i$ are the variable filter parameters provided by said control signal $t(n)$, and wherein $F_t(D_i)$ is a function of said $D_i$, preferably Taylor, Chebyshev or Legendre functions.

Consequently, all embodiments of the beamformer according to the invention have a polynomial filter characteristic, which is controlled by only adjusting the variable filter parameters $D_i$. Consequently, the system has the advantage that steering accuracy of the directivity of the beamformer is only dependent on the number precision of the computation means and beam steering can be done with a minimal computational effort.

The filtering characteristics of the beamformer is controlled in response to said variable filter parameters $D_i$ in order to achieve the best performance which can be controlled by different optimization criteria. The used optimization criteria depend on the desired measure of signal quality and filtering performance. A common measure of signal quality is the signal to noise ratio SNR, which is commonly understood as a signal power to noise power ratio. In this invention SNR is understood as a generic measure of signal quality. Examples of these alternative measures of signal quality are e.g. weighted signal to noise power ratio such as signal to noise loudness ratio, signal to interference and noise ratio SINR, signal to noise masking ratio, bit error rate BER, Signal to interference ratio SIR and co-channel interference CIR.

According to the invention the signal sources emit the signals into a noisy environment. Thus, the signals received from the transducer array are typically combinations of several signal components: signals originally emitted from the target signal source, their reflected components, reverberation, directional and diffuse noise signals, and other interfering signals such as acoustic echo. In this invention, all signal components that arrive from a direction different from the beamformer look direction $\phi_i$ are considered as noise components for the beamforming filter. Thus, it is not subject of this invention to try to equalize the multi-path propagation effects on the signal. On the contrary, beamforming is optimized to receive signals arriving from the target signal source direction while attenuating signals, i.e. noise, from other directions.

Figure 1:
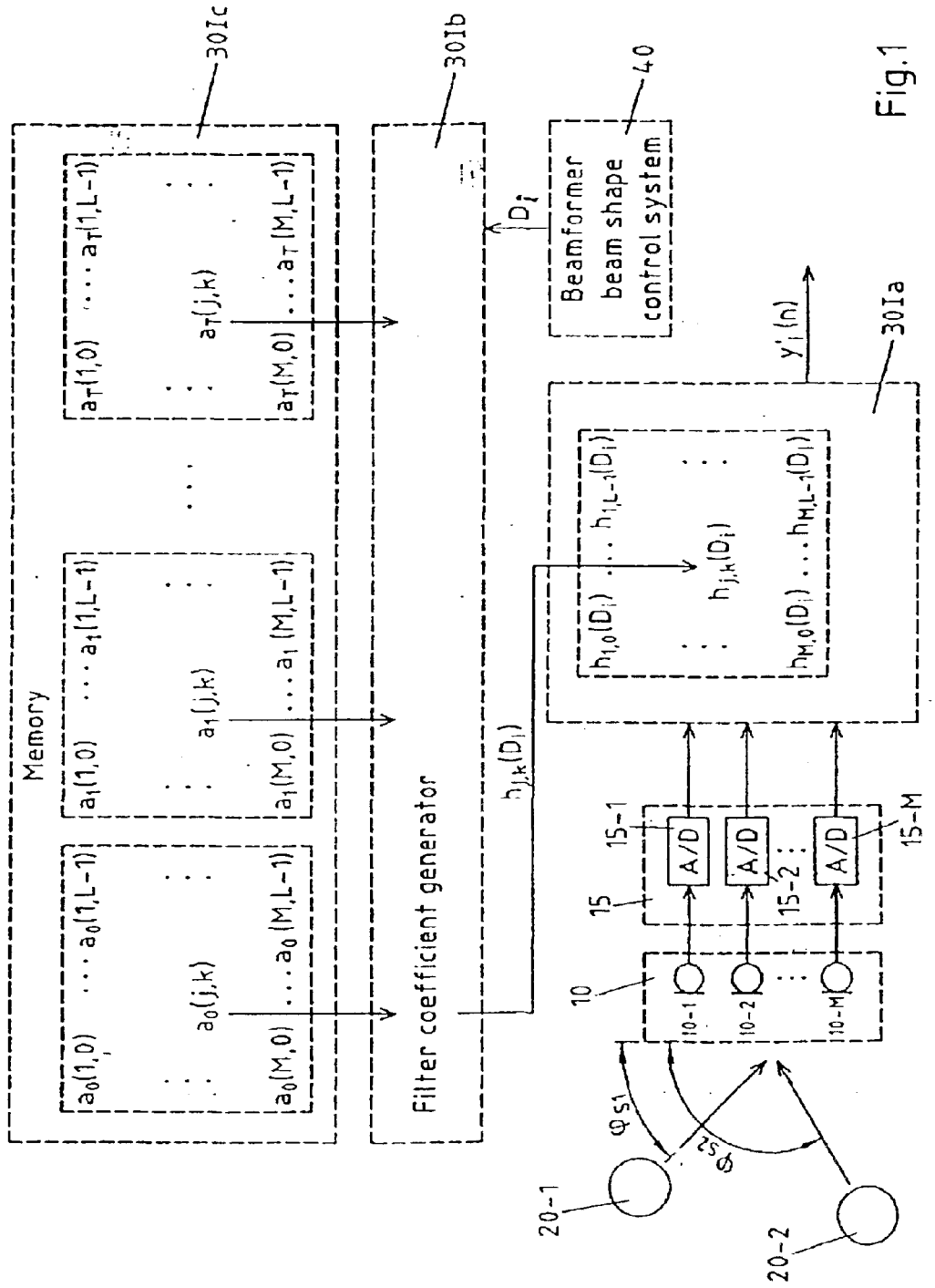
FIG. 1 shows the first embodiment of the system according to the invention.

FIG. 1 shows the first embodiment of the beamformer according to the invention. That beamformer 30I comprises a signal processing means 30Ia, a filter coefficient generator means 30Ib and a memory 30Ic.

The signal processing means 30Ia receives the input signals $x_1(n) \ldots x_M(n)$ output from said multi-channel analogue to digital converter 15 and the filter coefficients $h_{j,k}(D_i)$ from the filter coefficient generator means 30IIb in order to generate the beamformer output signal $y'_i(n)$ according to equation 5.

Figure 2:
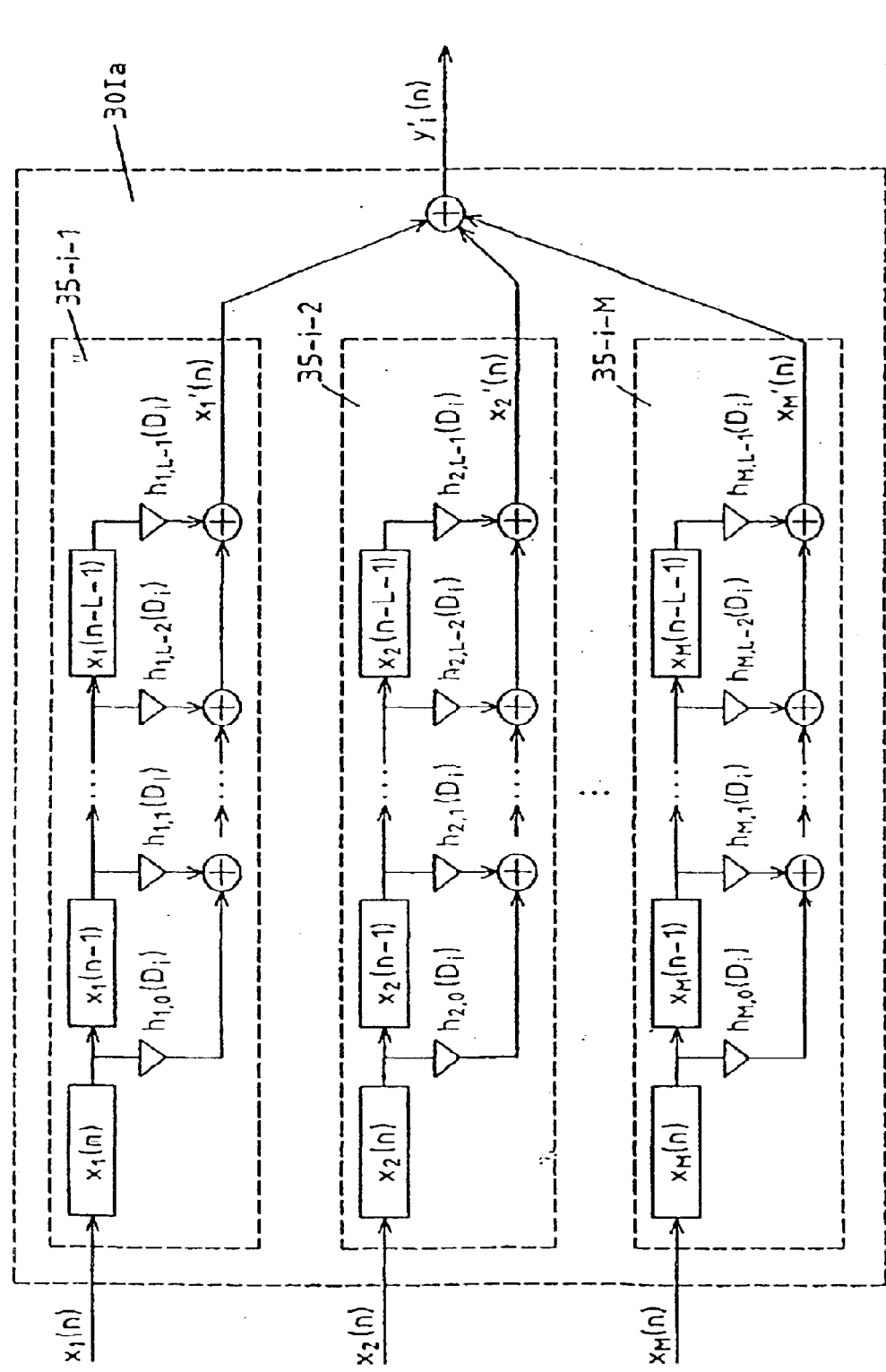
FIG. 2 shows a detailed illustration of a signal processing means according to FIG. 1.

FIG. 2 shows an implementation of a signal processing means for an elementary beamformer.

The memory 30Ic is provided to store several sets of the fixed filter parameters $a_t(j,k)$ such that they are accessible to the filter coefficient generator means 30Ib.

The filter coefficient generator means 30Ib receives said fixed filter parameters $a_t(j,k)$ from said memory 30Ic as well as the control signal $t(n)$ from a beamformer beam shape control system in order to adjust the filter coefficients of the beamformer 30Ia according to equation 6 before they are output to the signal processing means 30Ia.

Figure 3:
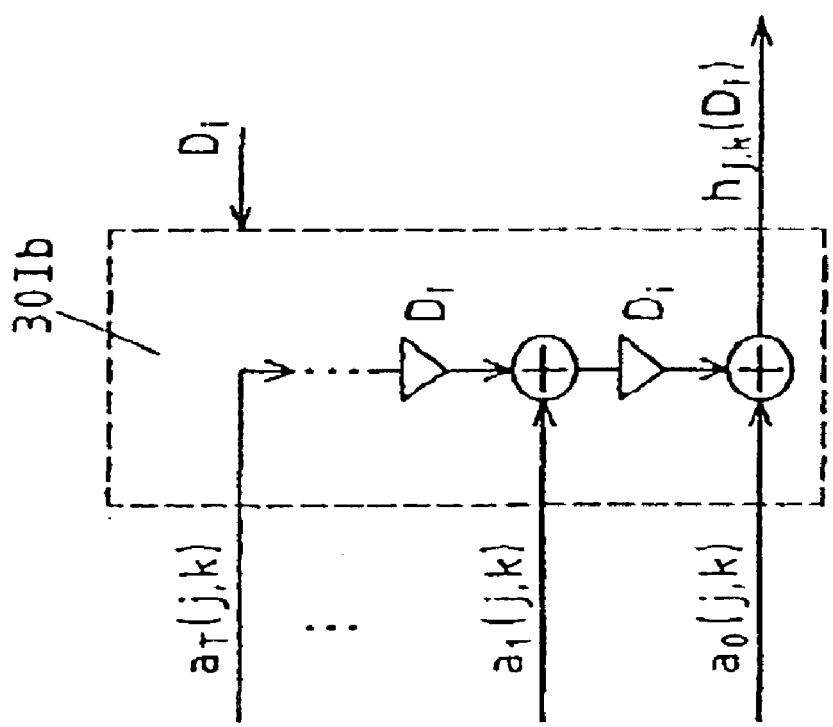
FIG. 3 shows a detailed illustration of a filter coefficient generator means according to FIG. 1.

FIG. 3 shows a particular embodiment of said filter coefficient generator means 30Ib receiving said fixed filter parameters $a_t(j,k)$ and variable filter parameters $D_i$ in order to generate said filter coefficients $h_{j,k}(D_i)$ according to equation $$h_{j,k}(D_i) = \sum_{t=0}^{T} a_t(j,k)D_i^t = a_0(j,k) + a_1(j,k)D_i + \ldots + a_T(j,k)D_i^T. \tag{7}$$

As becomes apparent from equations 6 and 7 in combination with equation 5 according to the first embodiment of the invention steering of the beamformer or especially steering of the filtering characteristics, e.g. look direction, of the beamforming filters, with respect to any target signal source direction is enabled by only varying the steering parameters $D_i$ as provided by said control signal $t(n)$. Consequently, the system has the advantage that the steering of the beam shape, look direction, or any other filter characteristic of the beamformer can be done with a minimal computational effort.

Said control signal $t(n)$ is provided to said filter coefficient generator means 30Ib by the beamformer beam shape control system 40.

Said beamformer beam shape control system 40 detects at least one physically relevant parameter for said target signal source 20, in particular said target signal source direction $\phi_s$ in which the signal is currently being emitted from. Based on the detected physical parameter the control system 40 generates said control signal $t(n)$, representing said variable filter parameters $D_i$, e.g. by utilizing an allocation table.

Respectively, each of said variable filter parameters $D_i$ represents one of the parameters source direction, source distance, noise spectrum, signal bandwidth, signal spectrum, beam shape, physical properties of the medium, camera control or a combination thereof.

According to equation 6 the filter coefficients of the beamformer are adjustable in response to said variable filter parameters $D_i$. By adjusting the filter coefficients the filtering characteristic of the beamformer is adapted to the current situation of target signal source represented by said detected physical parameters. Thus, the beam shape of the beamformer is aligned with the detected or tracked target signal source direction $\phi_s$.

In a preferred embodiment the signal source may be a speaker in a vehicle. In that case the beamformer beam shape control system may visually track the speaker direction as target signal source direction $\phi_s$. An acoustical sound tracking system is e.g. disclosed in the U.S. Pat. No. 4,741,038.

Figure 4:
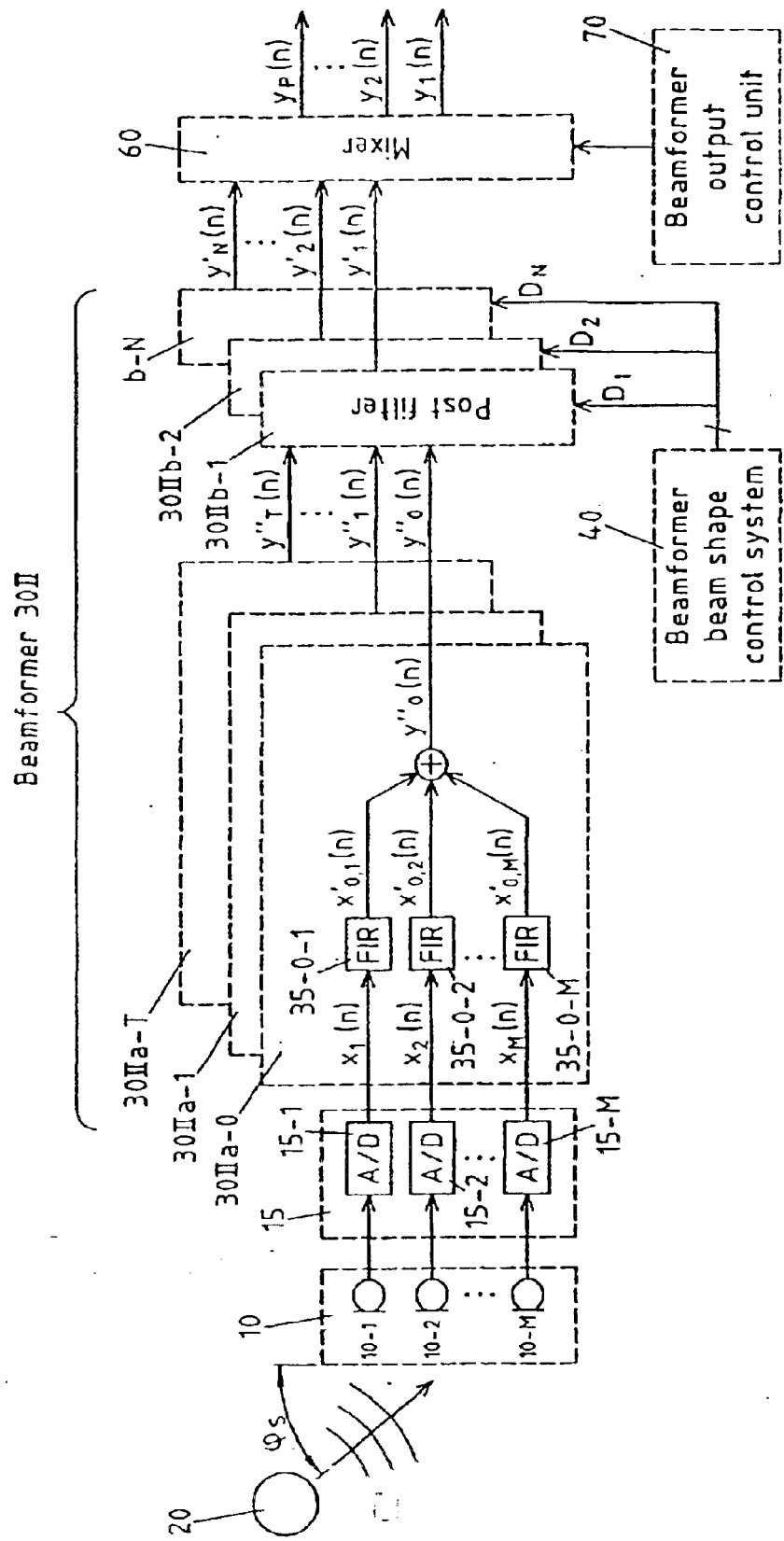
FIG. 4 shows the second embodiment of the system according to the invention.

FIG. 4 shows the second embodiment of the beamformer according to the invention. The beamformer 30II comprises of at least two filter banks 30IIa and of at least one post filter 30IIb.

Each of said filter banks 30IIa-t, t=0 . . . T, receives all of said sampled transducer output signals $x_m(n)$, m=1 . . . M and generates an intermediate signal $y''_t(n)$ according to the following equation:

$$y''_t(n) = \sum_{j=1}^{M}\sum_{k=0}^{L-1} a_t(j,k)x_j(n-k); t=0...T \qquad (8)$$

wherein $a_t(j,k)$ are the predetermined fixed filter parameters.

All of the intermediate signals $y''(n)$ generated by said filter banks 30IIa–t are communicated to at least one post filter 30IIb–i, respectively. In said post filter the intermediate signals are transformed into the beamformer output signal $y'_i(n)$ according to the following equation:

$$y'_i(n) = \sum_{t=0}^{T} y''_t(n)D_i^t; i=1...N \qquad (9)$$

wherein $D_i$ is the vector of variable filter parameters.

Figure 5B:
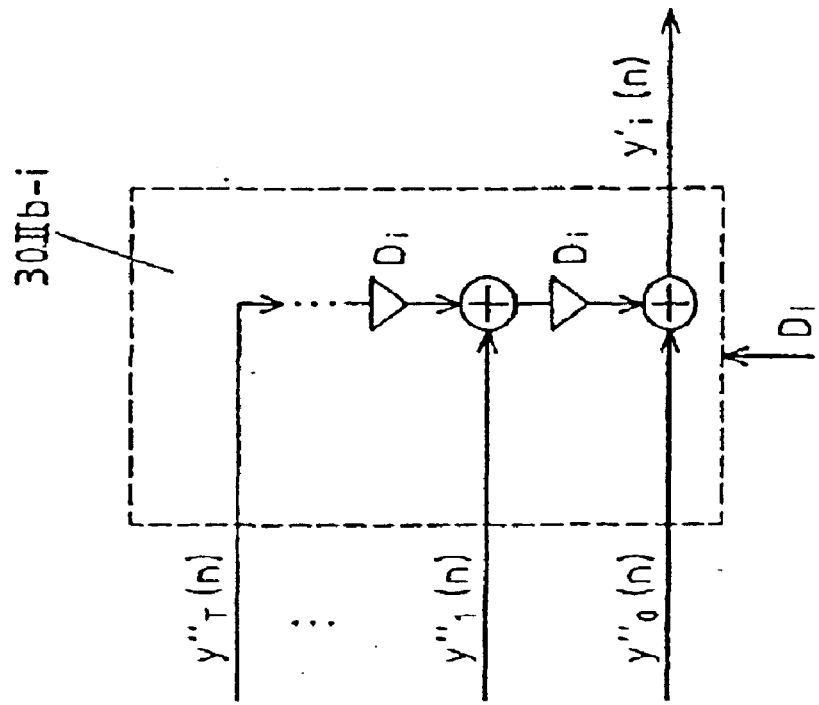
FIGS. 5a–d illustrate different embodiments of postfilters according to FIG. 4.
Figure 5A:
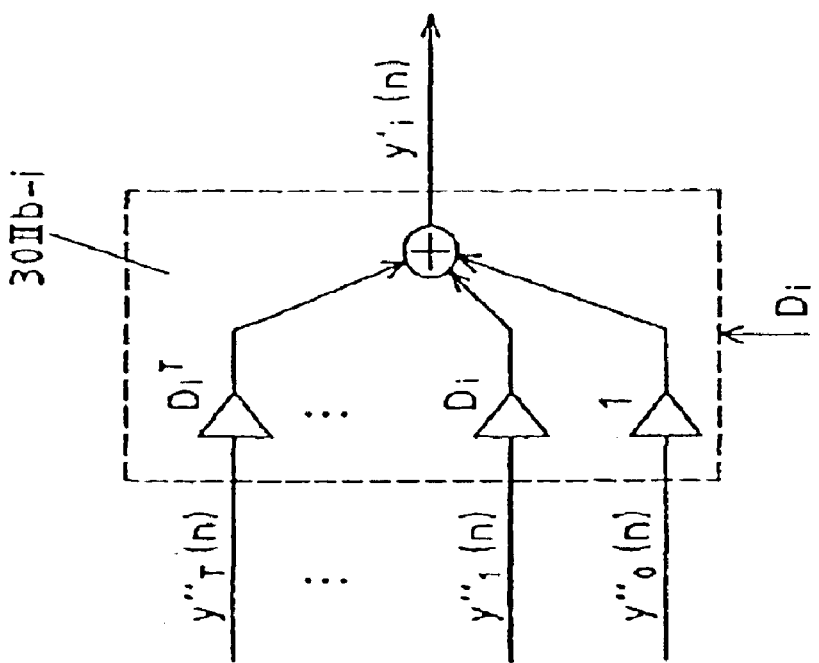

FIGS. 5a and 5b show two different embodiments of the post filter. In both cases the post filter comprises multiplication and addition units arranged in different ways to carry out equation 9.

The Chebyshev approximation $\hat{h}(D_i)$ is known in the art to yield the best approximation for a continuous function $h(D_i)$ in the sense that it minimizes the maximum error $$\Delta(h,\hat{h}) = \max_{D_i \in [-1,1]} |h(D_i) - \hat{h}(D_i)|. \qquad (10)$$

The Chebyshev approximation $\hat{h}_{j,k}(D_i)$ is calculated according to $$\hat{h}_{j,k}(D_i) = b_0(j,k)F_0(D_i) + b_1(j,k)F_1(D_i) + \ldots + b_T(j,k)F_T(D_i); \qquad (11)$$

wherein $F_t(D_i)$ are Chebyshev functions $$F_t(D_i) = \cos(t \cdot \arccos(D_i)), t=0 \ldots T \qquad (12)$$

and $D_i$ is set to $$D_i = \cos\left(\frac{2i+\pi}{T+2}\right), i=0...T \qquad (13)$$

and wherein $b_t$, t=0 . . . T, are variables which are calculated from the following linear system of T+1 equations $$h_{j,k}(D_i) = b_0(j,k)F_0(D_i) + b_1(j,k)F_1(D_i) + \ldots + b_T(j,k)F_T(D_i) \qquad (14)$$

for i=0 . . . T, wherein $h_{j,k}(D_i)$ are the known filter coefficients of the beamformer. A well-known recursion formula for the Chebyshev-functions $F_t(D_i)$ is $$F_0(D_i) = 1,$$

$$F_1(D_i) = D_i,$$

$$F_{t+1}(D_i) = 2D_i * F_t(D_i) - F_{t-1}(D_i) \qquad (15)$$

In the following, the second embodiment of the beamformer is adapted to use Chebyshev-functions and two different implementations are presented. It should be noted that it is straight forward to make similar modifications to the first embodiment of the beamformer by taking into account that the filter coefficient generator means 30Ib corresponds to the post filter 30IIb and the fixed coefficients in the memory 30Ic correspond to the fixed filter parameters in the filter banks 30IIa.

Figure 5C:
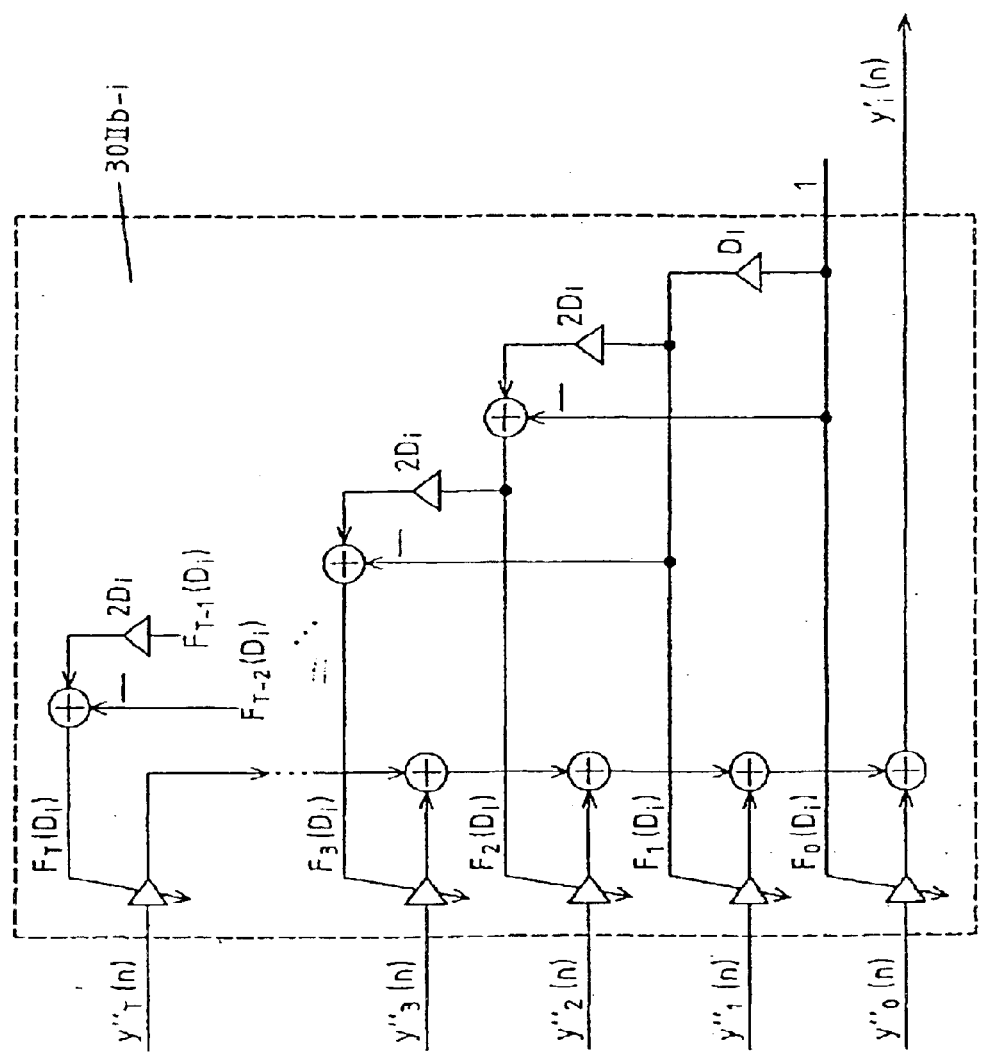

The first way to implement the Chebyshev approximation in the second embodiment of the beamformer replaces $a_t(j,k)$ in equation 8 with $b_t(j,k)$ by solving the linear system in equation 14 and uses a post filter shown in FIG. 5c to form the final output signal $$y'_i(n) = \sum_{t=0}^{T} y''_t(n)F_t(D_i). \qquad (16)$$

Figure 5D:
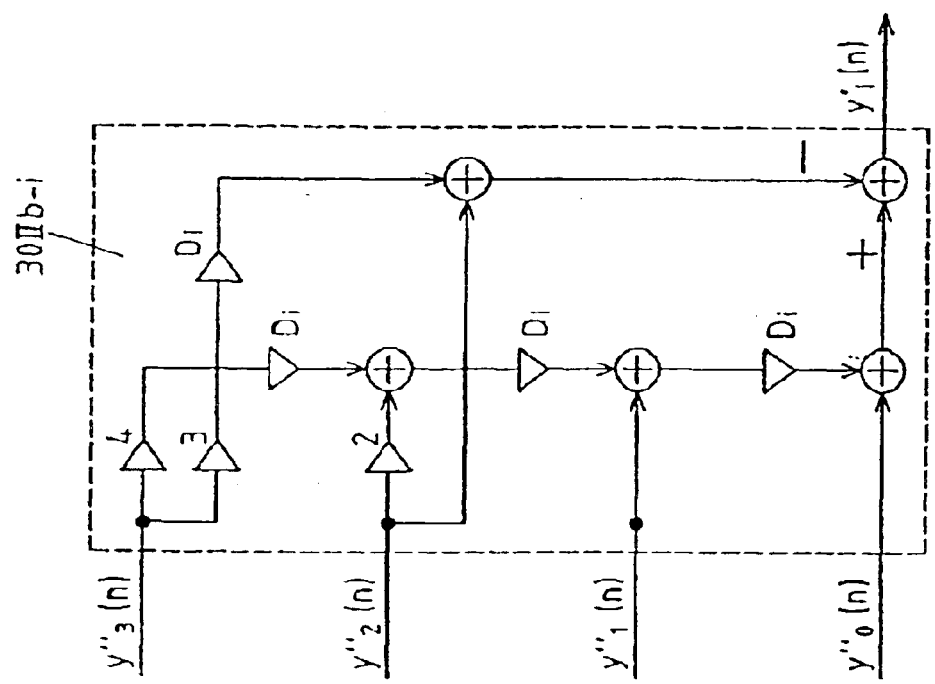

The post filter in FIG. 5c first calculates the functions $F_t(Di)$ for a given $D_i$ according to recursion formula in equation 15 and then uses the values of $F_t(D_i)$, t=0 . . . T, to form the final output signal $y'_i(n)$ according to equation 16. More specifically, FIG. 5d shows the corresponding post filter for a particular case of four intermediate signals $y''_0(n) \ldots y''_3(n)$ wherein $y'_i(n)$ is calculated according to equation 16 wherein the function values $F_t(D_i)$ are calculated according to recursion formula in equation 15 for t=0 . . . 3.

The second way to implement the Chebyshev approximation in the second embodiment of the beamformer is perhaps the most efficient in terms of computational load. It uses the post filter shown in FIG. 5b. The intermediate output signals $y''_t(n)$ are obtained by first solving the linear system in equation 14 for $b_t(j,k)$ and then grouping the resulting terms in a form of Taylor polynomial. For example, when T=3, the fixed filter parameters $a_t(j,k)$ in equation 8 can be calculated from the following equations:

$$a_0(j,k) = b_0(j,k) - b_2(j,k)$$

$$a_1(j,k) = b_1(j,k) - 3b_3(j,k)$$

$$a_2(j,k) = 2b_2(j,k)$$

$$a_3(j,k) = 4b_3(j,k) \qquad (17)$$

The fixed coefficients $a_t(j,k)$ are now comparable with the equations 5, 7, 8 and 9.

In the second embodiment of the beamformer the variable filter parameters $D_i$ are provided to the post filters in a form of said control signal t(n) generated by the beamformer beam shape control system as described above by referring to FIG. 1.

It shall be pointed out that an inclusion of equation 8 into equation 9 leads to equation 5 wherein the coefficients $h_{j,k}(D_i)$ are calculated according to equation 7. This becomes apparent from the following transformations:

$$y'_i(n) = \sum_{t=0}^{T} y''_t(n)D_i^t$$

-continued $$= \sum_{t=0}^{T} D_i^t \sum_{j=1}^{M} \sum_{k=0}^{L-1} a_t(j,k) x_j(n-k)$$

$$= \sum_{j=1}^{M} \sum_{k=0}^{L-1} \sum_{t=0}^{T} a_t(j,k) D_i^t x_j(n-k)$$

$$= \sum_{j=1}^{M} \sum_{k=0}^{L-1} h_{j,k}(D_i) x_j(n-k).$$

Consequently, the operation of the beamformers 30I and 30II are very similar.

The polynomial filtering according to the second embodiment of the beamformer requires $$Mem_{inv}(S) = M*L*(T+1) \tag{18}$$

coefficients to be stored in a memory. The method according to the invention requires only a small set of filter coefficients, thus the required memory capacity is low.

The beamformer 30II has a computational load of $$Load_{inv}(S) = M*L*(T+1) + S*T \tag{19}$$

multiply-and-accumulate operations per sampling interval.

The first term M*L*(T+1) in equation 19 represents the fixed number of operations that are necessary to calculate for the intermediate signals y"$_j$(n), which are the output signals of the filter banks. Because the number of said intermediate signals is independent of the number S of the beamformer output signals y'(n), the computational load for calculating these intermediate signals y"$_j$(n) is fixed according to the first term, no matter how many output signals will actually be made available by the post filters 30IIb-i or will be selected by the mixer 60.

According to equation 19 a cumulative load of T operations per target direction S is added to form the parallel output signals of the post filters y'$_i$(n).

Figure 6:
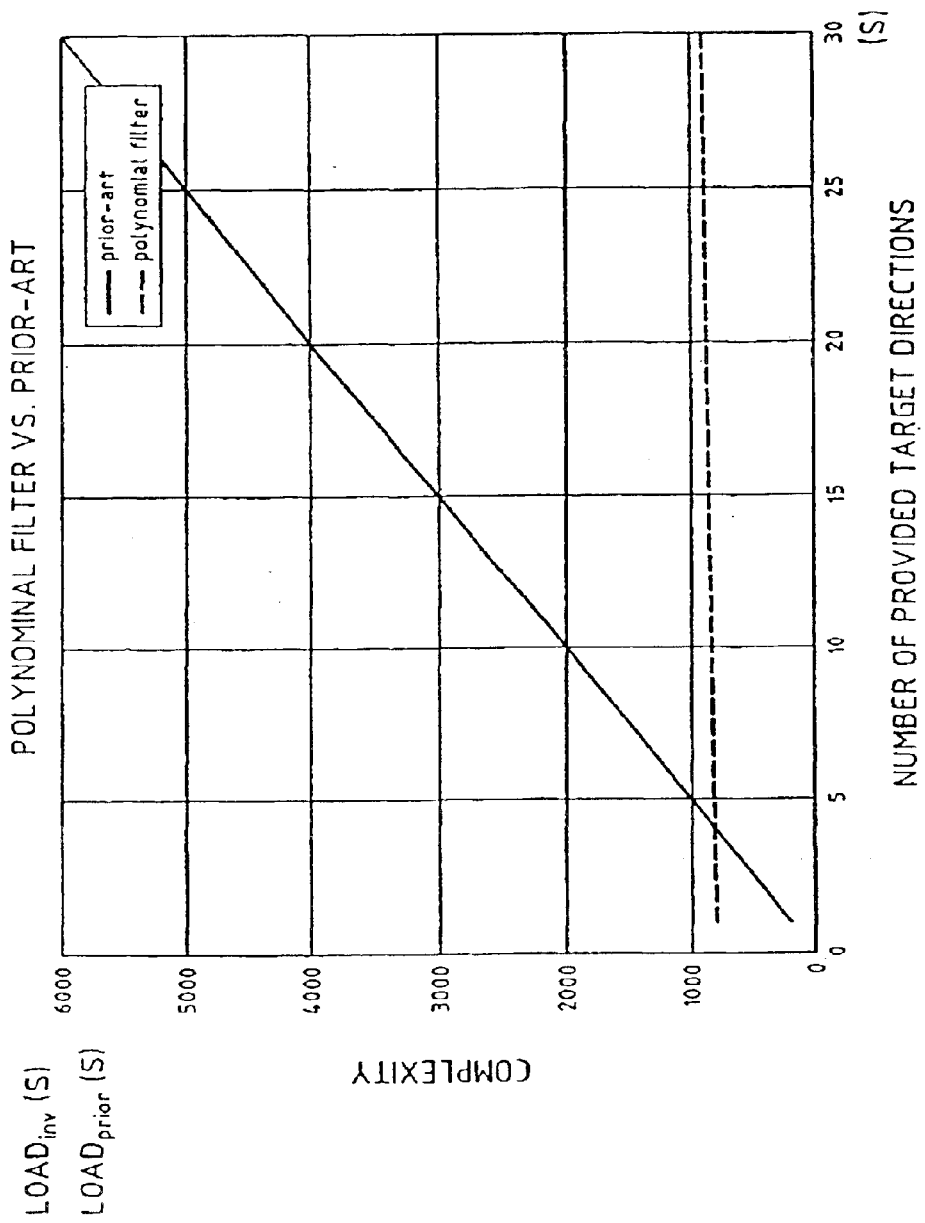
FIG. 6 illustrates the computational load of the system according to FIG. 4 versus a prior art system.

In FIG. 6 the computational load for a number of provided target directions S is illustrated for polynomial filtering according to the present invention versus a system known in the art. The load for the system according to the invention is calculated according to equation 19. To the contrary, the computational load for the system known in the art is calculated according to equation 4. Both lines in FIG. 6 are based on the example M=5, L=40, T=3. As can be seen from FIG. 6 the increase of the computational load required by the number of provided target directions is in the system according to the present invention rather low in comparison with the increase in a system known in the art. It can roughly be said that if the number of target directions is higher than T+1 the method according to the invention is very effective in comparison to the methods known in the art.

Figure 7:
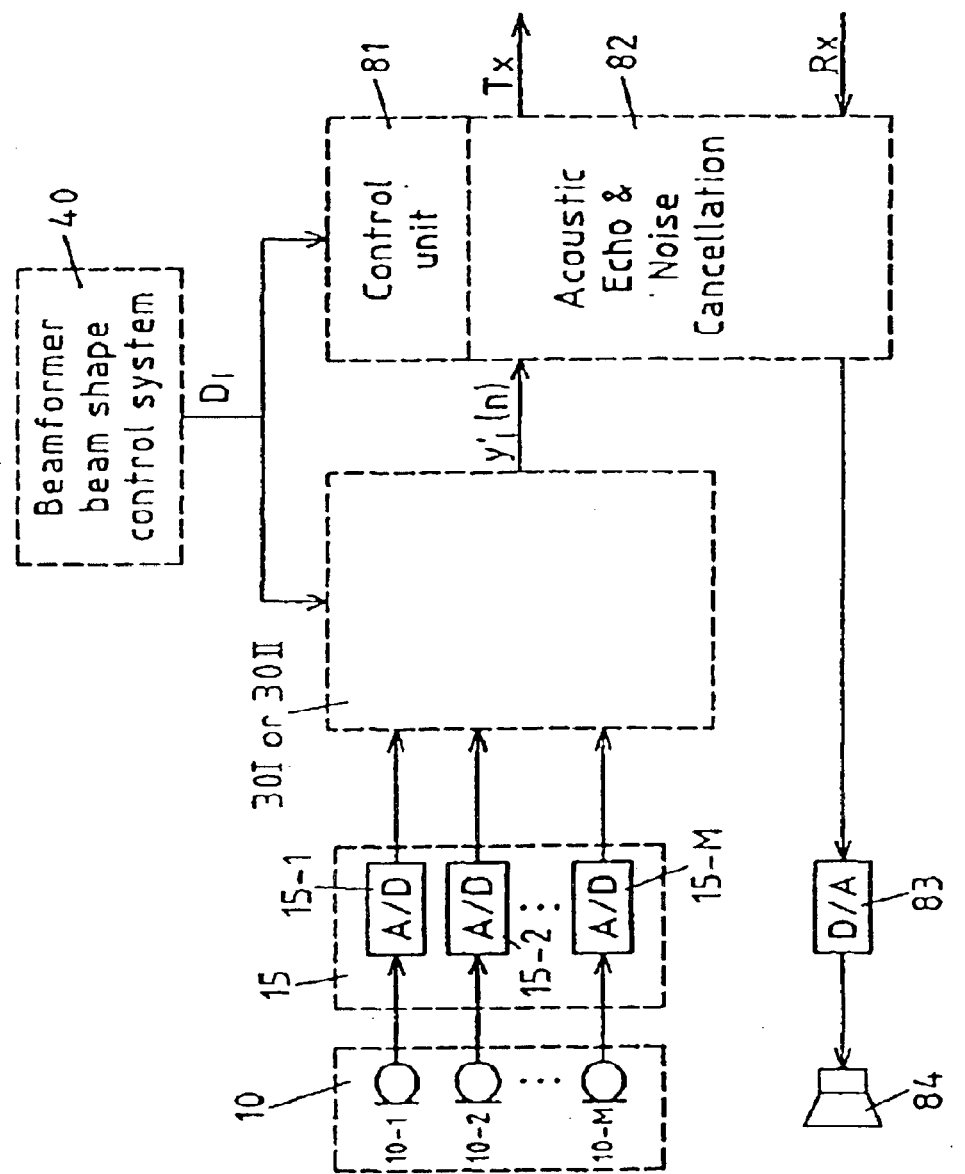
FIG. 7 illustrates the implementation of an echo and noise cancellation unit in the systems according to FIGS. 1 and 4.

FIG. 7 shows a further embodiment of the invention in which the beamformer output signals y'$_i$(n) are filtered by an echo and noise cancellation unit 82. The signal enhancement of the system combines the SNR improvement of the beamformer and noise attenuation of said echo and noise cancellation unit 82. It does not matter whether the beamformer filter implementation is based on the first 30I or on the second 30II embodiment of the beamformer.

As an example, in a typical acoustic space such as inside a vehicle the acoustic echo path is represented as a transfer function between the loudspeaker system 84 and the microphone array 10. The echo path is influenced by the directional sensitivity of the loudspeaker system, room acoustics, and the directional sensitivity of the microphone system. Consequently, any changes in the beamforming filtering would have an effect on the echo path. Most echo cancellation systems known in the art are based on adaptive filtering and are thus able to cope with these changes.

However, the control of such known echo cancellation systems can be improved according to the invention by taking into account the changes of the echo path due to the operation of the beamforming beam shape control system 40. This is achieved according to FIG. 7 by providing a control unit 81 for controlling said acoustic echo and noise cancellation unit 82 in response to said control signal t(n) provided by said beamformer beam shape control system 40. The control unit 81 can also be implemented for special noise cancellation units where in non-uniform noise environment the noise signal spectrum may become a function of directional sensitivity of the microphone array. In that case, the changes of the source tracking direction as detected by said beamformer beam shape control system can be utilized, e.g. for controlling background noise estimation.

The arrangement according to FIG. 7, in particular the described controlling of said echo and noise cancellation unit 82 makes the cancellation process robust against dynamic beamforming in a source tracking situation.

Figure 9A:
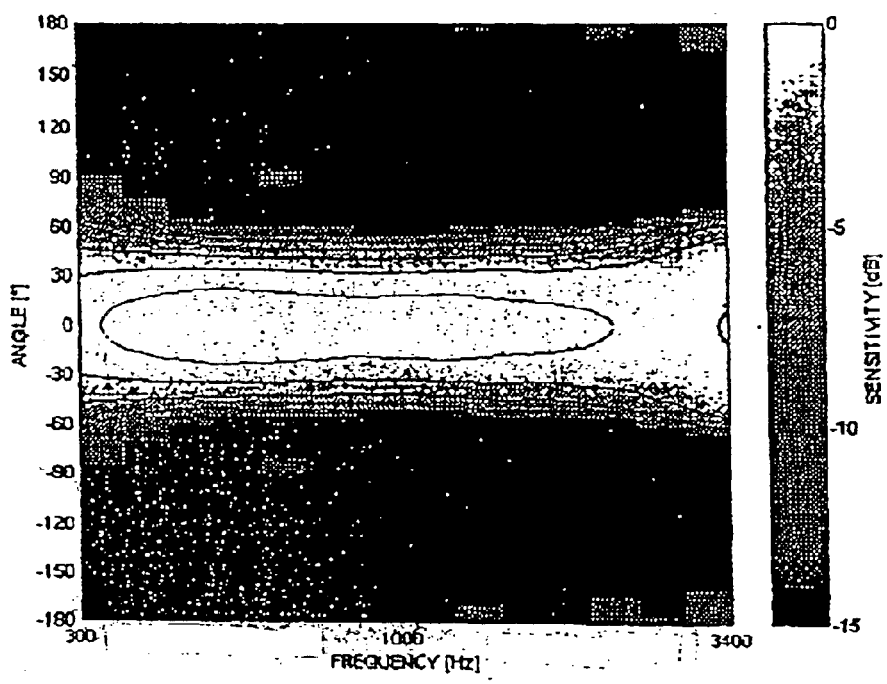
FIGS. 9a–c illustrate the changes in the sensitivity characteristics of the system according to FIGS. 1 and 5 when the look direction of the beamformer is varied.
Figure 9B:
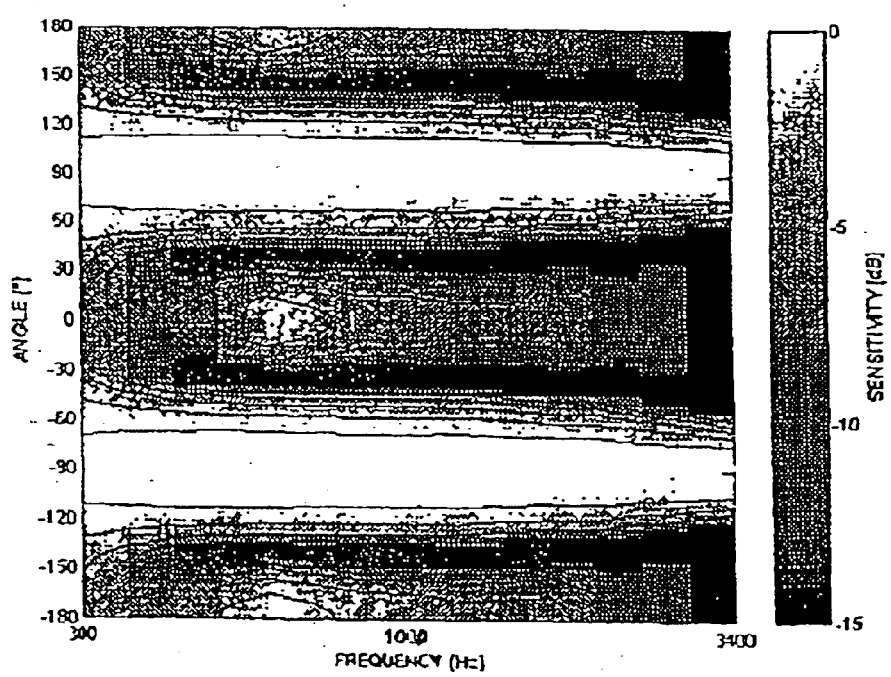
Figure 9C:
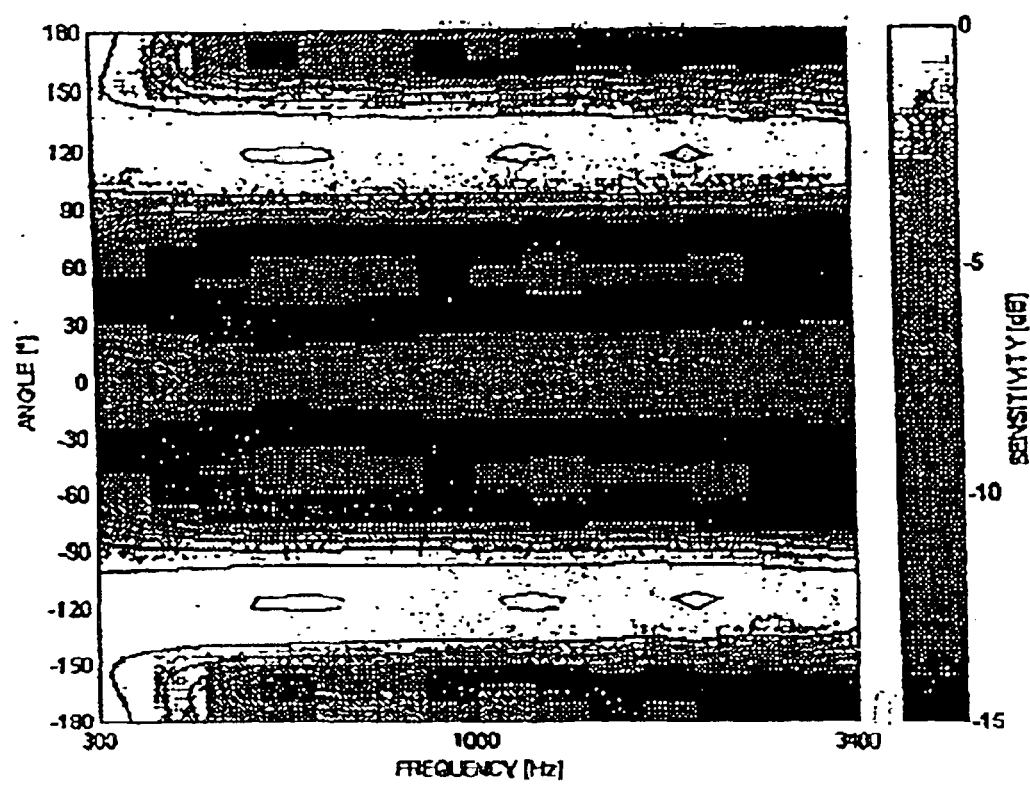
Figure 10:
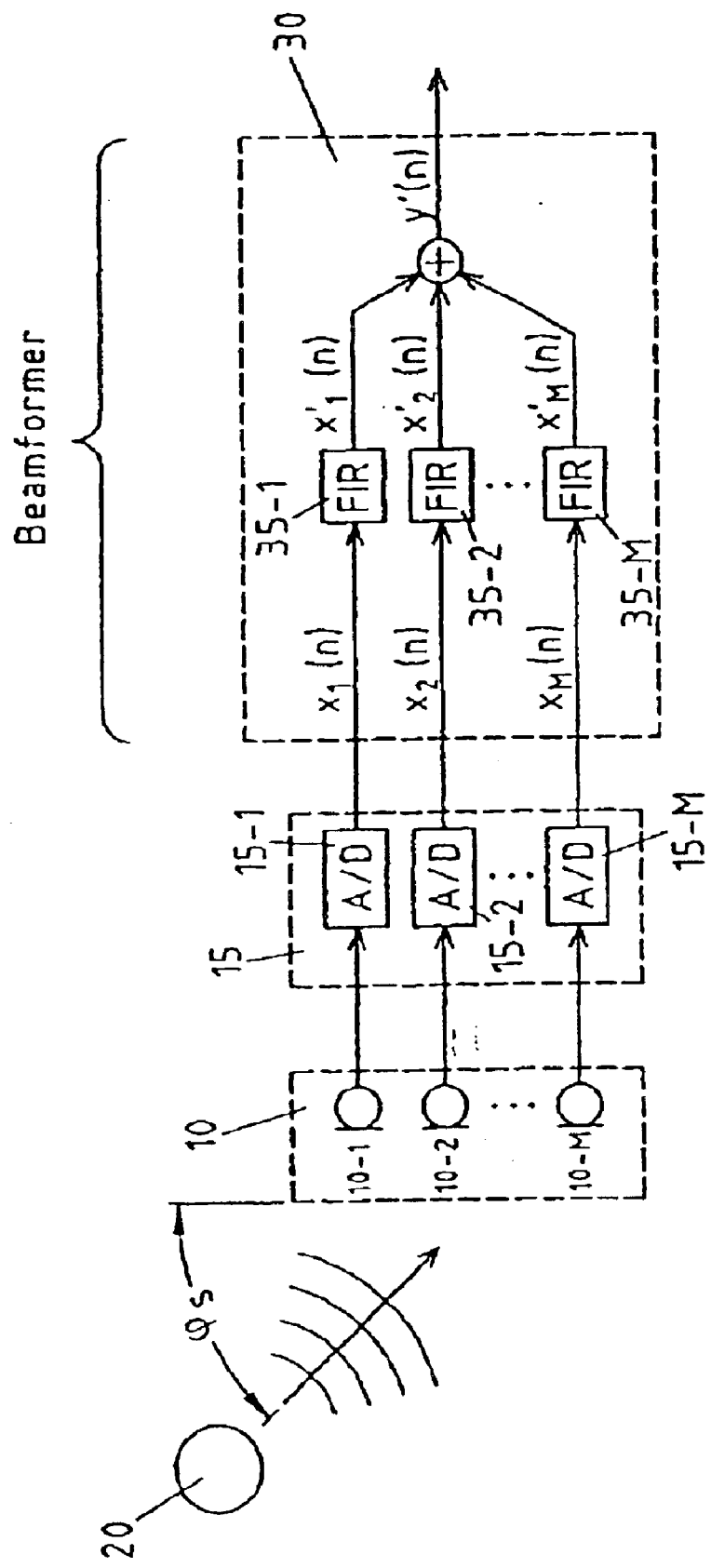
FIG. 10 shows an elementary system known in the art.
Figure 11:
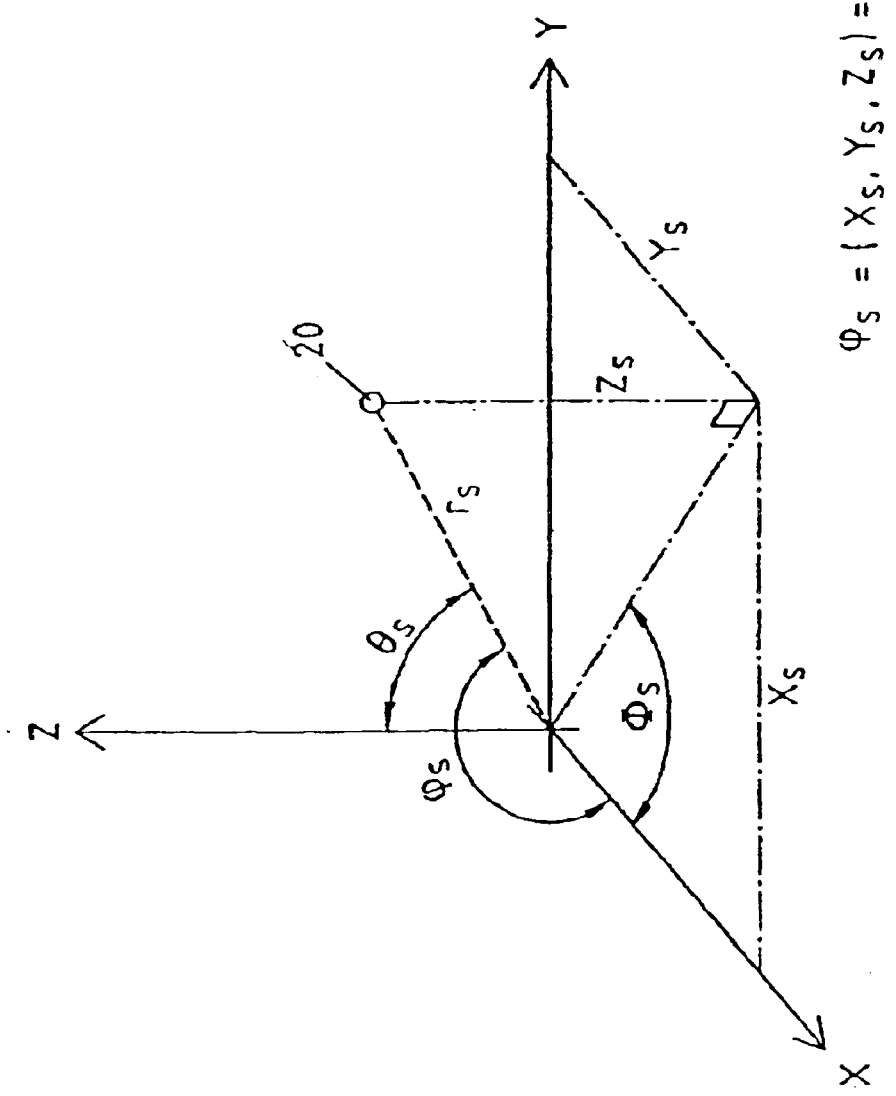
FIG. 11 shows a coordinate system illustrating the arrangement of a target signal source and a transducer array according to the prior art and to the present invention.

FIGS. 9a, 9b and 9c show the directional sensitivity of the system according to the invention in the plane represented by the paper sheet wherein an omni-directional transducer array 10 of the system is positioned in a coordinate system as shown in FIG. 8. As can be seen from FIG. 9 the sensitivity of the system is optimal, that means 0 dB when the variable filter parameter $D_i$ is selected corresponding to the target signal source direction $\phi_s$ in which the signal source 20 actually emits the signal towards said transducer array, namely 0° in FIG. 9a, +/−90° in FIG. 9b and +/−120° in FIG. 9c. The optimal signal reception is illustrated in FIGS. 9a, 9b, 9c by white sections. As can further be seen, if the variable filter parameter $D_i$ is tuned in the way that another angle for the directivity (look direction) of the system is selected the sensitivity of the system decreases as indicated by the dark sections. FIG. 9 illustrates the sensitivity of the system in a range from 300 Hz to 3400 Hz, which is the main range for a speech signal.

The invention is not restricted by the type of medium or environment in which the signals issued by the signal source propagate. The only restriction to the medium is that the propagation delay and attenuation between any two points in space must be predictable. Consequently, the system according to the present invention may be applied to signals propagating for example in air or water.

The invention is not restricted to in-vehicle audio applications although audio applications for car hands-free-environments represent a preferred embodiment of the invention.

What is claimed is:

1. A system for processing a signal being emitted from a target signal source (20) into a noisy environment wherein said target signal source (20) is located in a target signal source direction $\phi_s$ with regard to the position of a transducer array (10); the system comprising:

the transducer array (10) having M transducers for receiving said signal being mixed with noise, each of the transducers generating a corresponding transducer output signal, respectively;

a beamformer (30I, 30II) for receiving and filtering said M transducer output signals in order to generate at least one output signal y'$_1$(n) i=1 . . . N, said beamformer (30I, 30II) comprising adjustable filter coefficients defining a predetermined filtering characteristic;

a beamformer beam shape control system (40) providing a control signal $D_i(n)$ representing at least one physically relevant parameter for said target signal source (20); and a beamformer filtering characteristic adjusting means (30Ib, 30IIb) operating in response to said control signal $D_i(n)$ such that the beamformer (30I, 30II) has a predetermined filtering characteristic;

characterized in that said adjustable filter coefficients are defined by the following equation:

$$h_{j,k}(D_i) = \sum_{t=0}^{T} a_t(j,k) F_t(D_i),$$

wherein the $a_t(j,k)$ are fixed filter parameters, wherein $D_i$ is a vector of variable filter parameters representing said control signal $D_i(n)$; and wherein the $F_t(D_i)$ are functions of said $D_i$.

2. The system according to claim 1, characterized in that the number of variable filter parameters is less than the number of fixed filter parameters.

3. The system according to claim 1, characterized in that said vector of variable filter parameters $D_i$ is a single variable representing said target signal source direction $\phi_s$.

4. The system according to claim 2, characterized in that said vector of variable filter parameters $D_i$ is a vector containing multiple variable filter parameters.

5. The system according to claim 4, characterized in that the variable filter parameters represent one of the parameters source direction, source distance, noise spectrum, signal bandwidth, signal spectrum, beam shape, physical properties of the medium, camera control or a combination thereof.

6. The system according to claim 1, characterized in that said functions $F_t(D_i)$ form a Taylor polynomial $$h_{j,k}(D_i) = \sum_{t=0}^{T} a_t(j,k) D_i^t.$$

7. The system according to claim 1, characterized in that said functions $F_t(D_i)$ are Chebyshev polynomials $$F_t(D_i) = \cos(t \cdot \arccos(D_i)).$$

8. The system according to claim 1, characterized in that the system comprises a memory (30Ic) for storing the fixed filter parameters $a_t(j,k)$;

a filter coefficient generating means (30Ib) as beamformer filtering characteristic adjusting means for adjusting said filter coefficients according to the equation $$h_{j,k}(D_i) = \sum_{t=0}^{T} a_t(j,k) F_t(D_i); \text{ and}$$

a signal processing means (30Ia) for generating a beamformer output signal $y'_i(n)$, i=1 ... N, by using the equation $$y'_i(n) = \sum_{j=1}^{M} \sum_{k=0}^{L-1} h_{j,k}(D_i) x_j(n-k).$$

9. The system according to claim 1, characterized in that the beamformer (30II) comprises:

at least two filter banks (30IIa-0 ... 30IIa-T) each of which receiving and filtering said M transducer output signals in order to generate an intermediate signal $y'_t(n)$, t0 ... T;

at least one post filter (30IIb-1 ... 30IIb-N) as beamformer filtering characteristic adjusting means for receiving said at least two intermediate signals $y'_t(n)$ in order to generate said beamformer output signal $y'_i(n)$ i=1 ... N in response to said control signal $D_i(n)$.

10. The system according to claim 9, characterized in that each of said at least two filter banks (30IIa-0 ... 30IIa-T) calculates the intermediate signal $y''_t(n)$ from the transducer output signals $x_j(n-k)$ according to the following equation:

$$y''_t(n) = \sum_{j=1}^{M} \sum_{k=0}^{L-1} a_t(j,k) x_j(n-k)$$

wherein $a_t(j,k)$ are said predetermined fixed filter parameters; and that said post filter (30IIb-i) calculates the beamformer output signal $y'_i(n)$ from said intermediate signal $y''_t(n)$ according to the following equation:

$$y'_i(n) = \sum_{t=0}^{T} y''_t(n) D_i^t;$$

wherein $F_t(D_i)$ are said functions of said $D_i$.

11. The system according to claim 1, characterized in that the transducers (10-1 ... 10-M) are arranged linearly, 2-dimensionaly or 3-dimensionaly in said transducer array (10).

12. The system according to claim 1, characterized in that the transducers (10-1 ... 10-M) have a uni-directional, a bi-directional or an omni-directional sensitivity characteristics or a combination thereof.

13. The system according to claim 1, characterized in that the transducers (10-1 ... 10-M) in the transducer array (10) are microphones adapted for receiving acoustical signals.

14. The system according to claim 1, characterized in that the transducer array (10) is an antenna receiving electromagnetic signals.

15. The system according to claim 1, characterized in that the transducer array (10) is a sonar array.

16. The system according to claim 1, characterized in that the system comprises at least one mixer (60) for receiving and further processing at least two of said beamformer output signals $y'_i(n)$.

17. The system according to claim 1, characterized in that the system comprises echo cancellation unit (82) for canceling echo effects in the output signal $y'_i(n)$ of the beamformer.

18. The system according to claim 17, characterized in that the system comprises at echo cancellation control unit (81) for controlling said echo cancellation unit in response to said control signal.

19. The system according to claim 1, characterized in that the system comprises a noise cancellation unit (82) for canceling noise in the output signal y'$_i$(n) of the beamformer.

20. The system according to claim 19, characterized in that the system comprises a noise cancellation control unit (81) for controlling said noise cancellation unit in response to said control signal.

21. The system of claim 1, wherein said at least one physically relevant parameter for said target source includes said target signal source direction $\phi_s$.

22. A method for processing a signal being emitted from a target signal source (20) into a noisy environment, wherein said target signal source (20) is located in a target signal source direction $\phi_s$ with regard to the position of a transducer array (10), the method comprising the following steps:

receiving sad signal by said transducer array (10) and generating a corresponding transducer output signal;

filtering said transducer output signal according to adjustable filter coefficients in order to generate at least one beamformer output signal y'$_i$(n), i=1 . . . N, the filter coefficients defining a desired predetermined filter characteristic;

detecting at least one physically relevant parameter, and providing a control signal D$_t$(n) representing said physically relevant parameter; and generating said filter coefficients in response to said control signal D$_t$(n) such that the beamformer (30I, 30II) has a predetermined filtering characteristic; characterized in that said adjustable filter coefficients are defined by the following equation:

$$h_{j,k}(D_i) = \sum_{t=0}^{T} a_t(j,k) F_t(D_i),$$

wherein the a$_t$(j,k) are fixed filter parameters, wherein D$_t$ is a vector of variable filter parameters representing said control signal D$_t$(n); and wherein the F$_t$(D$_i$) are functions of said D$_i$.

23. The system according to claim 1, wherein said predetermined filtering characteristic of the beamformer (30I, 30II) is a desired look direction.

24. The system of claim 23, further wherein said predetermined filtering characteristic of the beamformer (30I, 30II) is that said target signal source (20) is at said target signal source direction $\phi_s$.

25. The method of claim 22, wherein said predetermined filter characteristic is a desired look direction.

26. The method of claim 25, further wherein said predetermined filter characteristic of the beamformer (30I, 30II) is that said target signal source (20) is at said target signal source direction $\phi_s$.

27. The method of claim 22, wherein the detecting at least one physically relevant parameter includes detecting said target signal source direction $\phi_s$.

* * * * *

UNITED STATES PATENT AND TRADEMARK OFFICE
CERTIFICATE OF CORRECTION

PATENT NO.   : 6,836,243 B2
DATED        : December 28, 2004
INVENTOR(S)  : Kajala et al.

It is certified that error appears in the above-identified patent and that said Letters Patent is hereby corrected as shown below:

<u>Title page,</u>
Item [75], Inventor, the residence of "Matti Hämäläinen," should be -- Lempaala -- not "Kanvatie".

<u>Column 14,</u>
Line 65, "y'$_1$" should be -- y'$_i$ --.

<u>Column 16,</u>
Lines 12 and 15, "y'''" should be -- y'' --.
Line 35, (second equation), $$y'_i(n) = \sum_{i=0}^{T} y''_i(n)(D_i)$$

should be:

$$y'_i(n) = \sum_{i=0}^{T} y''_i(n) F_i(D_i)$$

<u>Column 16,</u>
Line 61, please insert the word -- an -- before the word "echo".
Line 65, please delete the word "at" and replace with -- an --.

<u>Column 17,</u>
Line 16, please delete the word "sad" and replace with -- said --.

UNITED STATES PATENT AND TRADEMARK OFFICE
CERTIFICATE OF CORRECTION

PATENT NO. : 6,836,243 B2
DATED : December 28, 2004
INVENTOR(S) : Kajala et al.

It is certified that error appears in the above-identified patent and that said Letters Patent is hereby corrected as shown below:

Column 18,
Line 10, "$D_t$" should be -- $D_i$ --.

Signed and Sealed this

Nineteenth Day of April, 2005

JON W. DUDAS
*Director of the United States Patent and Trademark Office*